(12) United States Patent
Nomoto (10) Patent No.: US 7,718,465 B2
(45) Date of Patent: May 18, 2010

(54) SEMICONDUCTOR DEVICE AND PROCESS FOR PRODUCING SAME

(75) Inventor: Kazumasa Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 563 days.

(21) Appl. No.: 11/458,573

(22) Filed: Jul. 19, 2006

(65) Prior Publication Data

US 2007/0026554 A1    Feb. 1, 2007

(30) Foreign Application Priority Data

Jul. 28, 2005    (JP)    ............... P2005-218224

(51) Int. Cl.
*H01L 51/40*    (2006.01)
(52) U.S. Cl. ............... 438/99; 438/29; 438/149; 438/164; 257/E51.001; 257/E51.02; 257/E51.022
(58) Field of Classification Search ............ 438/99, 438/29, 149, 164; 257/40, E51.001, E51.02, 257/E51.022
See application file for complete search history.

(56) References Cited

U.S. PATENT DOCUMENTS

| 6,517,995 | B1 | 2/2003 | Jacobson et al. | |
|---|---|---|---|---|
| 2003/0230747 | A1 | 12/2003 | Ostergard | |
| 2004/0013982 | A1* | 1/2004 | Jacobson et al. | 430/320 |
| 2005/0071969 | A1 | 4/2005 | Sirringhaus et al. | |
| 2006/0148167 | A1* | 7/2006 | Brown et al. | 438/232 |

FOREIGN PATENT DOCUMENTS

| JP | 2003-509228 | 3/2003 |
|---|---|---|
| JP | 2004-158815 | 3/2004 |
| JP | 2004-186393 | 7/2004 |
| JP | 2004-241397 | 8/2004 |
| WO | 03083960 A | 10/2003 |
| WO | 2004/055920 | 7/2004 |
| WO | 2004055920 A | 7/2004 |
| WO | 2004/111729 | 12/2004 |
| WO | 2005038881 A | 4/2005 |

OTHER PUBLICATIONS

Austin et al., "Fabrication of 70 nm channel length polymer organic thin-film transistors using nanoimprint lithography," Applied Physical Letters, vol. 81, No. 23, Dec. 2, 2002, pp. 4431-4433.
Kumar et al., "Patterning Self-Assembled Monolayers: Applications in Materials Science," Langmuir 1994,10, pp. 1498-1511.
Japanese Office Action issued on Sep. 15, 2009, for corresponding Japanese Patent Application JP 2005-218224.

* cited by examiner

*Primary Examiner*—Alexander G Ghyka
*Assistant Examiner*—Abdulfattah Mustapha
(74) *Attorney, Agent, or Firm*—K&L Gates LLP (57) ABSTRACT

A semiconductor device and process for producing same are provided. The process for producing a semiconductor device includes a first embossing step of pressing a stamp having a relief pattern onto a surface of a substrate to form a depression pattern on the surface of the substrate; a second step of feeding an application material composed of a semiconductor material or a conductive material into the depression pattern by printing; and a third step of curing the application material fed by printing.

12 Claims, 5 Drawing Sheets

SEMICONDUCTOR DEVICE AND PROCESS FOR PRODUCING SAME

CROSS REFERENCES TO RELATED APPLICATIONS

This patent application claims priority to Japanese Patent Application JP 2005-218224 filed in the Japanese Patent Office on Jul. 28, 2005, the entire contents of which is incorporated herein by reference.

BACKGROUND

The present invention generally relates to semiconductor devices and processes for producing semiconductor devices. In particular, the present invention relates to a process for producing a semiconductor device, the process including forming a pattern by printing. The present invention also relates to a semiconductor device produced by the process.

In recent years, semiconductor devices including active layers containing organic semiconductor materials have been receiving attention. In such a semiconductor device including the organic semiconductor material, it is possible to form the active layer composed of the organic semiconductor material by application at a low temperature. Thus, the semiconductor device including the organic semiconductor material has an advantage in view of cost reduction. Furthermore, the semiconductor device can be formed on a low-heat-resistant flexible substrate, such as a plastic substrate. Moreover, a gate insulating film, a source electrode, a drain electrode, and a gate electrode in addition to the active layer can be formed by patterning using printing with application materials, thus leading to further cost reduction.

An inkjet printing has been studied as a method for forming a pattern with such an application material. Various materials can be applied by the inkjet printing as long as the materials each have a viscosity of several centipoises. However, in the inkjet printing, in view of the difficulty in controlling the amount of ink discharged and the precision of the position into which the ink is discharged, printing precision is about 20 µm at the present time. Thus, to increase the precision, a method for forming banks composed of polyimide or the like at the periphery of a position into which the ink is discharged has been proposed.

On the other hand, in addition to such an inkjet printing, a method for forming a fine pattern by printing, such as screen printing, which uses a template (screen), has been studied. Among printing with such a template, a nanoimprinting in which a fine structure is formed by pressing a stamp having a relief pattern against an uncured film formed by application is described by Michael D. Austin and Stephen Y. Chou [Appl. Phys. Lett., Vol. 81, 4431 (2002)] (Non-Patent Document 1). A method of using an elastomeric stamp having a relief pattern is proposed in PCT Japanese Translation Patent Publication No. 2003-509228 (Patent Document 1). Furthermore, microcontact printing using a stamp made by transferring a fine pattern formed by lithography into an elastomeric plastic is proposed in A. Kumar, G. M. Whiteside et al. [Langmuir, Vol. 10, 1498 (1994)].

However, in applying the above-described printing methods to production processes of semiconductor devices, there are problems described as follows.

In forming a fine pattern by inkjet printing, it may be essential to form banks at the periphery of a region into which the ink is discharged, as described above. Thus, it may be necessary to perform many additional steps, such as an applying step of applying a material constituting the banks, for example, polyimide, and a patterning step of patterning the applied film by photolithography, thereby disadvantageously complicating the production process.

In screen printing, it is difficult to form a film having a thickness of 1 µm or less. Thus, for example, when an active layer pattern composed of an organic semiconductor material is formed by screen printing, a step height of 1 µm or more occurs at the surface. Therefore, when a multilayer interconnection is formed on the active layer pattern, a portion not covered with an interlayer insulating film easily occurs at a side wall of the step, thereby possibly causing a short circuit between an upper lead and an lower lead.

In contrast, in nanoimprinting and microcontact printing, it is possible to form a fine pattern having a step height of 1 µm or less. However, in these printing methods, there are limits to the compatibility (adhesion) between an application material and a stamp and between the material and a substrate on which a fine pattern is formed by printing. Thus, any material cannot be always used for pattern formation by these printing methods.

SUMMARY

Accordingly, it is desirable to provide a process for producing a semiconductor device by using an application material, wherein the process may provide a high-precision fine pattern by printing to achieve higher chip density without leading to the complication of the production process. It is also desirable to provide a semiconductor device obtained by the production process.

According to an embodiment of the present invention, there is provided a process for producing a semiconductor device including a first embossing step of pressing a stamp having a relief pattern onto a surface of a substrate to form a depression pattern on the surface of the substrate; a second step of feeding an application material composed of a semiconductor material or a conductive material into the depression pattern by printing; and a third step of curing the application material fed by printing. Furthermore, according to another embodiment of the present invention, there is provided a semiconductor device obtained by the production process.

According to the production process in an embodiment, in the first step, since the depression pattern is formed by embossing with the stamp prepared, the depression pattern is formed through only a single step. That is, the depression pattern is formed through a smaller number of steps compared with the case of forming banks on a substrate. In the second step, since the application material is fed into the depression pattern by printing, the extension of the application material on the substrate is limited. Thus, the application material is fed by printing into the depression pattern with satisfactory position accuracy and form accuracy and then cured to form a layer composed of the semiconductor material or the conductive material.

Additional features and advantages are described herein, and will be apparent from, the following Detailed Description and the figures.

DETAILED DESCRIPTION

Embodiments of the present invention will be described in detail below and as referenced in the drawings. A thin-film transistor produced by a process for producing a semiconductor device according to an embodiment is described.

FIGS. 1A to 1E are each a cross-sectional process drawing illustrating a production process according to a first embodiment. FIG. 2 is a plan view of a thin-film transistor produced according to the first embodiment. The first embodiment in which a top-gate thin-film transistor is produced by a process according to an embodiment of the present invention will be described on the basis of the cross-sectional process drawings shown in FIGS. 1A to 1E while referring to FIG. 2.

Figure 1A:
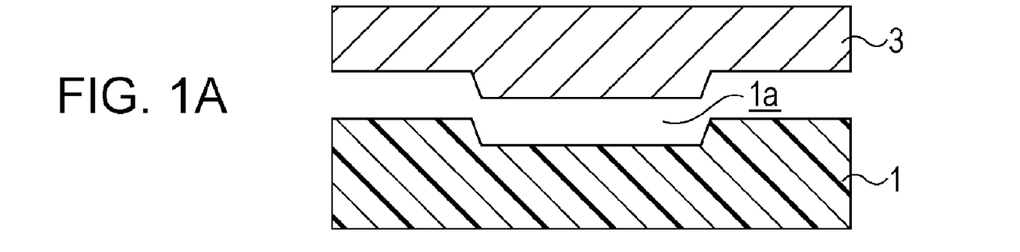
FIGS. 1A to 1E are each a cross-sectional process drawing illustrating a production process according to a first embodiment.
Figure 2:
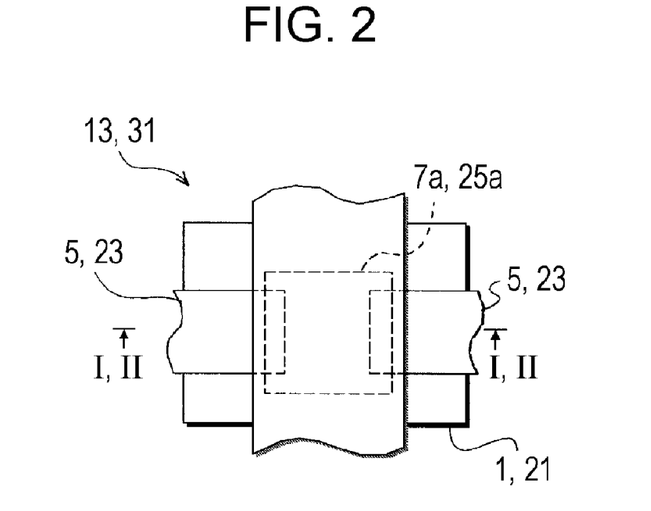
FIG. 2 is a plan view of a top-gate thin-film transistor produced according to the first embodiment and a second embodiment.

As shown in FIG. 1A, a stamp 3 having a relief pattern on a surface thereof is pressed against a substrate 1 to form a depression pattern 1a. In other words, a surface of the substrate 1 is processed by embossing to form the depression pattern 1a. The depression pattern 1a has the shape of an active layer in the thin-film transistor to be produced in this embodiment and is in the form of a rectangle.

The substrate 1 is a plastic substrate composed of, for example, a polyethylene terephthalate (PET), a polyether sulfone (PES), or a polyethylene naphthalate (PEN). Alternatively, the substrate 1 may be a plastic substrate or a glass substrate having a buffer layer composed of a resin material that is easily processed by embossing. When the substrate 1 has the buffer layer on a surface thereof, the buffer layer is subjected to embossing to form the depression pattern 1a.

The stamp 3 has a protrusion pattern corresponding to the depression pattern 1a, the protrusion pattern being disposed on a main surface thereof. The stamp 3 is composed of a material having a softening temperature or a glass transition temperature higher than that of the substrate 1 or the buffer layer constituting the surface layer.

In forming the depression pattern 1a by embossing the substrate 1, the temperature of the substrate 1 is increased to a temperature higher than the softening temperature or the glass transition temperature of the surface layer of the substrate 1 while the stamp 3 is being pressed onto a surface of the substrate 1. This forces the protrusion portion of the stamp 3 into the surface layer of the substrate 1. The substrate 1 is cooled to cure while the stamp 3 is being pressed. Then, the stamp 3 is detached from the substrate 1.

Figure 1B:
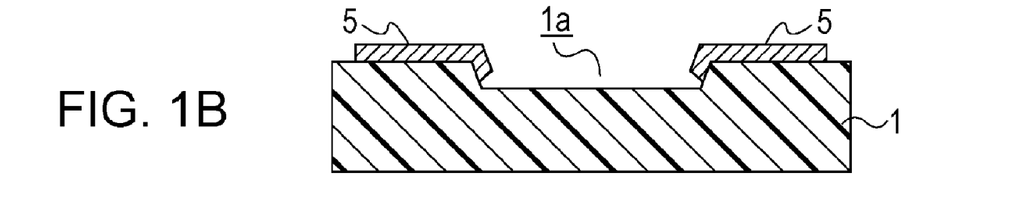

As shown in FIG. 1B, source/drain electrodes 5 are formed by patterning so as to be in contact with both edges of the depression pattern 1a. In this case, the source/drain electrodes 5 is formed by, for example, printing, such as inkjet printing, microcontact printing, or a screen printing, or photolithography.

In view of the simplification of the process, preferably, the source/drain electrodes 5 are formed by printing. In this case, for example, printing with a paste or a liquid application material containing a conductive material is employed. That is, the application material is applied in a pattern by printing and then solidified to form the source/drain electrodes 5.

On the other hand, to form finer source/drain electrodes 5 with high precision, patterning using lithography is preferably employed. In this case, a formed electrode material layer is pattern-etched with a resist pattern as a mask, the resist pattern being formed by lithography. Alternatively, after the formation of the electrode material layer covering a resist pattern formed by lithography, the electrode material layer disposed on the resist pattern is removed together with the resist pattern by a lift-off method. Even in this case, in view of the simplification of the process, preferably, the electrode material layer is formed by application.

Figure 1C:
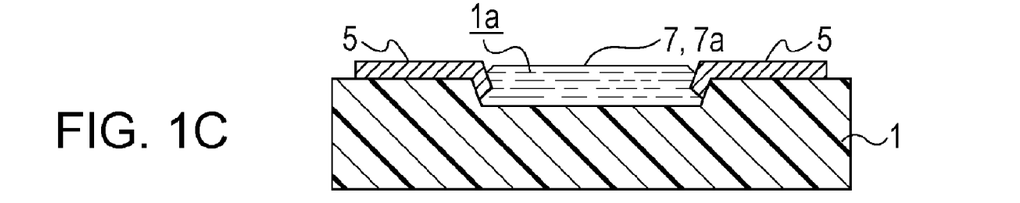

As shown in FIG. 1C, an application material 7 containing an organic semiconductor material is fed into the depression pattern 1a by printing through the tip of an application nozzle. In this case, for example, the application material 7 is fed into the depression pattern 1a by being dropped through the tip of the application nozzle using inkjet printing, dispensing, or the like. The volume of the liquid application material 7 containing the organic semiconductor material dissolved in a solvent is substantially equal to the capacity of the depression pattern 1a.

The application material 7 fed by printing is solidified to form an active layer 7a composed of the organic semiconductor material. In this case, the solvent in the liquid application material 7 is removed by evaporation to solidify the application material 7, resulting in the active layer 7a. Furthermore, in this case, the volume of the application material 7 fed by printing is substantially equal to the capacity of the depression pattern 1a, and then the application material 7 is solidified. Thus, the height of the surface of the active layer 7a is substantially the same as that of the surface of the substrate 1. The active layer 7a is in contact with the source/drain electrodes 5 at the side walls of the depression pattern 1a.

The formation of the source/drain electrodes 5 described with reference to FIG. 1B and the formation of the active layer 7a described with reference to FIG. 1C may be performed in inverse order as long as damage to the active layer 7a is prevented. When the formation steps are performed in inverse order, and the height of the surface of the active layer 7a formed by printing is higher than that of the surface of the substrate 1, if necessary, the active layer 7a may be planarized by polishing in such a way that the height of the surface of the active layer 7a is substantially the same as that of the surface of the substrate 1, and then the source/drain electrodes 5 may be formed.

Figure 1D:
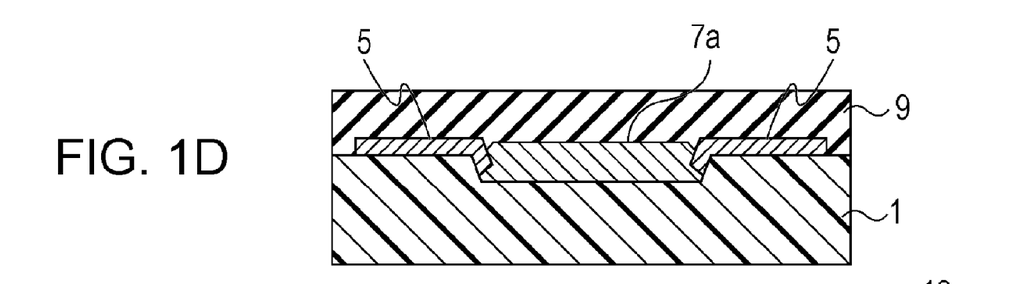

As shown in FIG. 1D, a gate insulating film 9 is formed on the substrate 1 by an application method, such as spin coating or slit coating, so as to cover the active layer 7a and the source/drain electrodes 5. In this case, since the height of the surface of the active layer 7a is substantially the same as that of the surface of the substrate 1, the active layer 7a does not have the effect on the formation of the gate insulating film 9 by the application method.

Figure 1E:
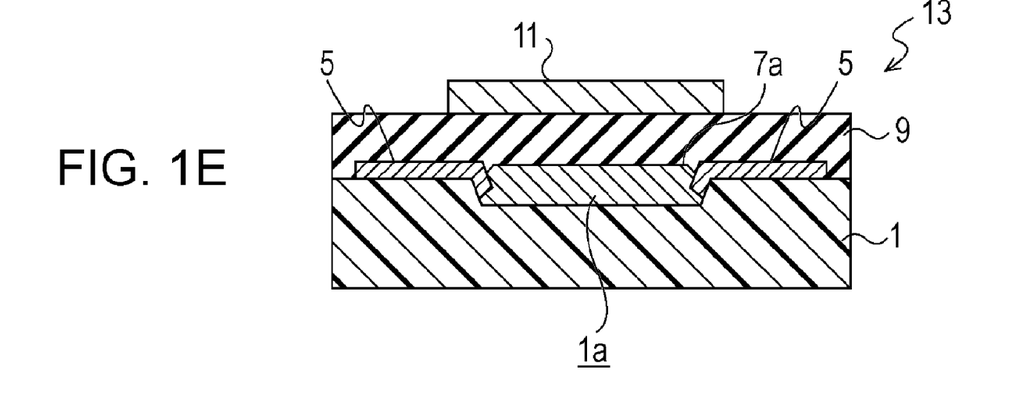

As shown in FIG. 1E, a gate electrode 11 is formed on the gate insulating film 9 and over the active layer 7a between the source/drain electrodes 5. The gate electrode 11 is formed by printing, such as inkjet printing, microcontact printing, or screen printing, or photolithography as the method for forming the source/drain electrodes 5 illustrated with reference to FIG. 1B.

As described above, a top-gate thin-film transistor is produced as a semiconductor device 13.

The semiconductor device 13 includes the active layer 7a composed of an organic semiconductor material and formed by solidifying the application material; and the depression pattern 1a disposed at the surface of the substrate 1, the depression pattern 1a being selectively filled with the active layer 7a.

In the production process according to the first embodiment, as described with reference to FIG. 1A, since the depression pattern 1a is formed by embossing with a single stamp 3, the depression pattern 1a is formed through only a single step. That is, the depression pattern 1a can be formed through a smaller number of steps compared with the case of forming banks on a substrate to form a depression pattern. As described with reference to FIG. 1C, since the application material is fed by printing into the depression pattern 1a formed by embossing, the extension of the application material on the substrate is limited. Thus, the application material 7 can be applied by printing into the depression pattern 1a with satisfactory position accuracy and form accuracy.

As a result, it is possible to feed the application material by printing with satisfactory position accuracy and form accuracy through a smaller number of steps. Thus, the active layer 7a can be formed with high precision by printing without leading to the complication of the production process. Therefore, it is possible to achieve higher levels of integration of the semiconductor device 13 (thin-film transistor) including the active layer 7a.

Second Embodiment

Figure 3A:
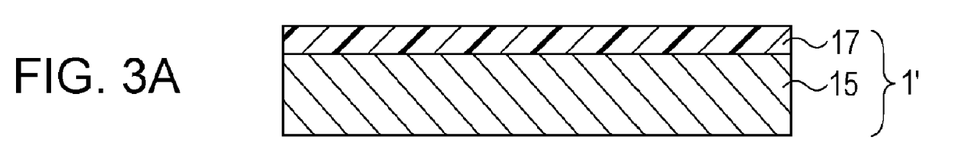
FIGS. 3A to 3C are each a cross-sectional process drawing illustrating part of a production process according to the second embodiment.
Figure 3B:
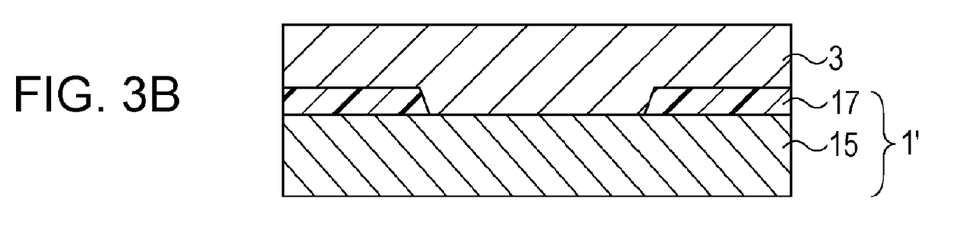
Figure 3C:
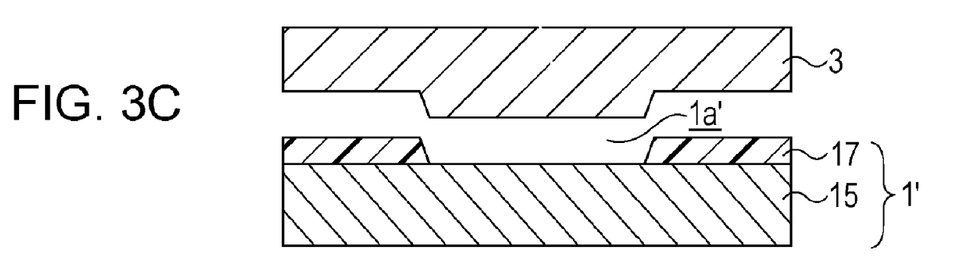

FIGS. 3A to 3C are each a cross-sectional process drawing illustrating a production process according to a second embodiment. The differences between the second embodiment and the first embodiment are the structure of a substrate 1' and a procedure for forming a depression pattern 1a'. The subsequent steps are the same as those in the first embodiment.

In the second embodiment, as shown in FIG. 3A, the substrate 1' including a resin material layer 17 disposed on a material substrate 15 is prepared. The material substrate 15 is a plastic substrate, a glass substrate, or the like. The resin material layer 17 is composed of an ultraviolet-curable resin or a thermosetting resin and is provided in an uncured state by an application method.

As shown in FIG. 3B, the stamp 3 is pressed onto the surface of the substrate 1'. The same stamp 3 as that in the first embodiment may be used. The uncured resin material layer 17 is cured while the stamp 3 is being pressed. In this case, when the resin material layer 17 is composed of an ultraviolet-curable resin, the resin material layer 17 is irradiated with ultraviolet rays from the transparent component side of the stamp 3 and material substrate 15, thereby curing the resin material layer 17. On the other hand, when the resin material layer 17 is composed of a thermosetting resin, the resin material layer 17 is cured by heating.

When the resin material layer 17 is cured, as shown in FIG. 3C, the stamp 3 is detached from the substrate 1'. As a result, the depression pattern 1a' corresponding to the protrusion pattern of the stamp 3 is formed at the surface of the substrate 1'.

Then, the same steps as those described in the first embodiment with reference to FIG. 1B and the subsequent figures are performed to produce a top-gate thin-film transistor as in the first embodiment.

Also in the production process according to the second embodiment, the depression pattern 1a' is formed by embossing, and then an application material is fed by printing into the depression pattern 1a' to form an active layer. Therefore, it is possible to form the active layer with high precision by printing without leading to the complication of the production process, as in the first embodiment.

In particular, when the resin material layer 17 described in FIG. 3A is composed of an ultraviolet-curable resin, there is no need for heating in order to cure the resin material layer 17 during embossing. Thus, the material substrate 15 constituting the substrate 1' is not stressed by heat. Furthermore, a material having low resistance to heat can be used as the material substrate 15.

Third Embodiment

FIGS. 4A to 4E are each a cross-sectional process drawing illustrating a production process according to a third embodiment. The third embodiment in which a top-gate thin-film transistor is produced by a process according to another embodiment of the present invention will be described on the basis of FIGS. 4A to 4E. The plan view of the thin-film transistor produced according to this embodiment is the same as that of FIG. 2 in the first embodiment.

Figure 4A:
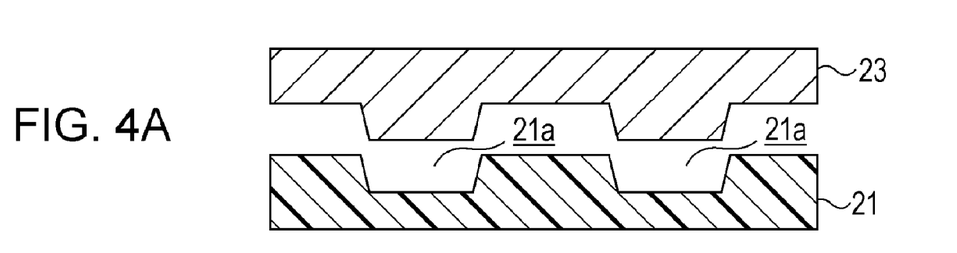
FIGS. 4A to 4E are each a cross-sectional process drawing illustrating a production process according to a third embodiment.

As shown in FIG. 4A, a stamp 23 having a relief pattern is pressed against a substrate 21 to form a depression pattern 21a at the surface of the substrate 21 by embossing. The depression pattern 21a has a pattern for source/drain electrodes and serves as wiring grooves.

Figure 4B:
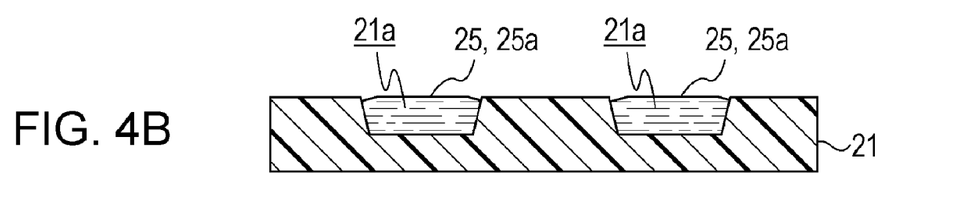

As shown in FIG. 4B, an application material 25 containing a conductive material is fed into the depression pattern 21a by printing through the tip of an application nozzle. In this case, for example, the application material 25 is fed into the depression pattern 21a by being dropped through the tip of the application nozzle using inkjet printing, dispensing, or the like. In this case, the volume of the liquid application material 25 containing the conductive material dispersed in a solvent is substantially equal to the capacity of the depression pattern 21a.

The application material 25 fed by printing is solidified to form source/drain electrodes 25a each composed of a conductive material. In this case, the solvent in the liquid application material 25 is removed by evaporation to solidify the application material 25, resulting in the source/drain electrodes 25a. Furthermore, in this case, the volume of the application material 25 fed by printing is substantially equal to the capacity of the depression pattern 21a, and then the application material 25 is solidified. Thus, the height of the surface of each of the source/drain electrodes 25a is substantially the same as that of the surface of the substrate 21.

When the height of the surface of each of the source/drain electrodes 25a formed by printing is higher than that of the surface of the substrate 21, if necessary, the source/drain electrodes 25a may be planarized by polishing in such a way that the height of the surface of each of the source/drain electrodes 25a is substantially the same as that of the surface of the substrate 21.

Figure 4C:
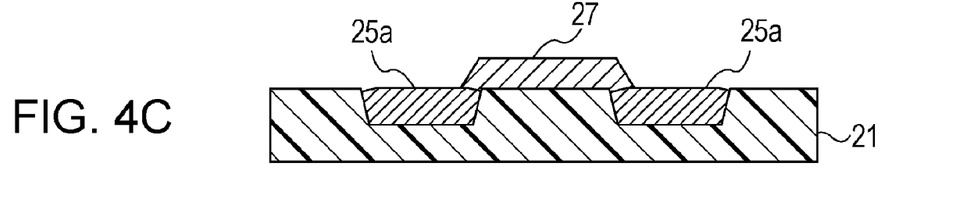

As shown in FIG. 4C, an active layer 27 is formed in such a way that both edges of the active layer 27 are disposed on the source/drain electrodes 25a. In this case, the active layer 27 composed of an organic semiconductor material is formed by printing, such as inkjet printing, microcontact printing, or screen printing.

The formation of the source/drain electrodes 25a illustrated with reference to FIG. 4B and the formation of the active layer 27 illustrated with reference to FIG. 4C may be performed in inverse order as long as damage to the active layer 27 is prevented.

Figure 4D:
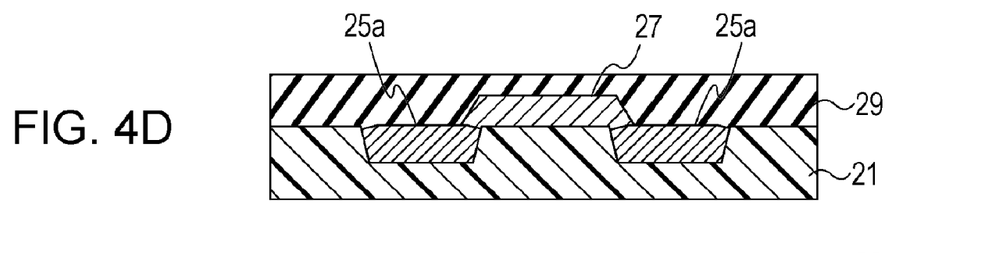
Figure 4E:
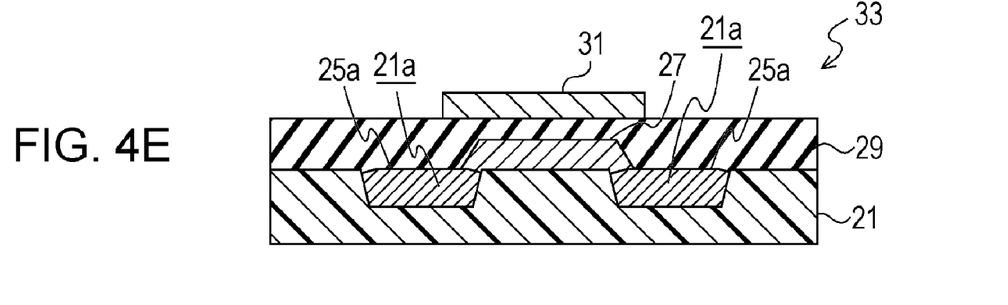

Subsequent steps shown in FIGS. 4D and 4E are performed as in the first embodiment illustrated with reference to FIGS. 1D and 1E.

That is, as shown in FIG. 4E, a gate insulating film 29 is formed on the substrate 21 by an application method, such as spin coating or slit coating, so as to cover the active layer 27 and the source/drain electrodes 25a. In this case, since the height of the surface of each of the source/drain electrodes 25a is substantially the same as that of the surface of the substrate 21, the source/drain electrodes 25a do not have the effect on the formation of the gate insulating film 29.

As shown in FIG. 4E, a gate electrode 31 is formed on the gate insulating film 29 and over the active layer 27 between the source/drain electrodes 25a. The gate electrode 31 is formed by printing, such as inkjet printing, microcontact printing, or screen printing, or photolithography as the method for forming the source/drain electrodes 5 illustrated with reference to FIG. 1B.

As described above, a top-gate thin-film transistor is produced as a semiconductor device 33.

The semiconductor device 33 includes the source/drain electrodes 25a each composed of a conductive material and formed by solidifying the application material; and the depression pattern 21a disposed at the surface of the substrate 21, the depression pattern 21a is selectively filled with the source/drain electrodes 25a.

In the production process according to the third embodiment, as described with reference to FIGS. 4A and 4B, the application material is fed by printing into the depression pattern 21a formed by embossing and is solidified to form the source/drain electrodes 25a. Thus, the depression pattern 21a can be formed through a smaller number of steps compared with the case of forming banks on a substrate to form a depression pattern. Therefore, the application material can be fed by printing with satisfactory position accuracy and form accuracy through a smaller number of steps, thereby forming the source/drain electrodes 25a. As a result, it is possible to achieve higher levels of integration of the semiconductor device 33 (thin-film transistor) including the source/drain electrodes 25a.

In the third embodiment, the source/drain electrodes 25a, which are required to have lower resistance and narrow line widths, are disposed in the depression pattern 21a. Thus, even when the source/drain electrodes 25a have increased thickness in order to achieve lower resistance, it is possible to suppress the height in which the source/drain electrodes 25a project from the surface of the substrate 21. Therefore, after the formation of the source/drain electrodes 25a, the steps described with reference to FIG. 4C and the subsequent figures can be performed on a more flat surface, thus ensuring the ease of the process.

The production process according to the third embodiment may be combined with that of the second embodiment. In this case, the steps described in the second embodiment with reference to FIGS. 3A to 3C are applied to the step of forming the depression pattern 21a described with reference to FIG. 4A.

Fourth Embodiment

FIGS. 5A to 5E are each a cross-sectional process drawing illustrating a production process according to a fourth embodiment. FIG. 6 is a plan view of a thin-film transistor produced according to this embodiment. The fourth embodiment in which a bottom-gate thin-film transistor is produced by a process according to an embodiment of the present invention will be described on the basis of the cross-sectional process drawings shown in FIGS. 5A to 5E while referring to FIG. 6.

Figure 5A:
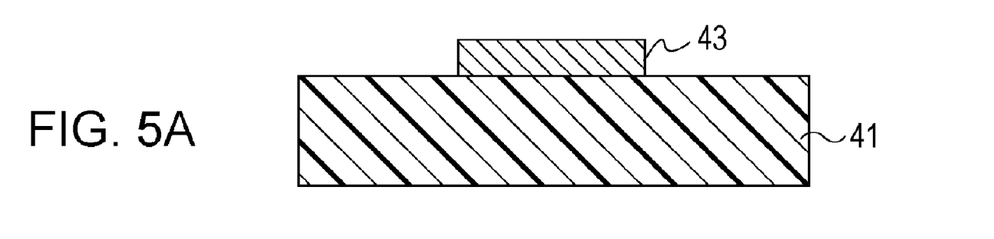
FIGS. 5A to 5E are each a cross-sectional process drawing illustrating a production process according to a fourth embodiment.
Figure 6:
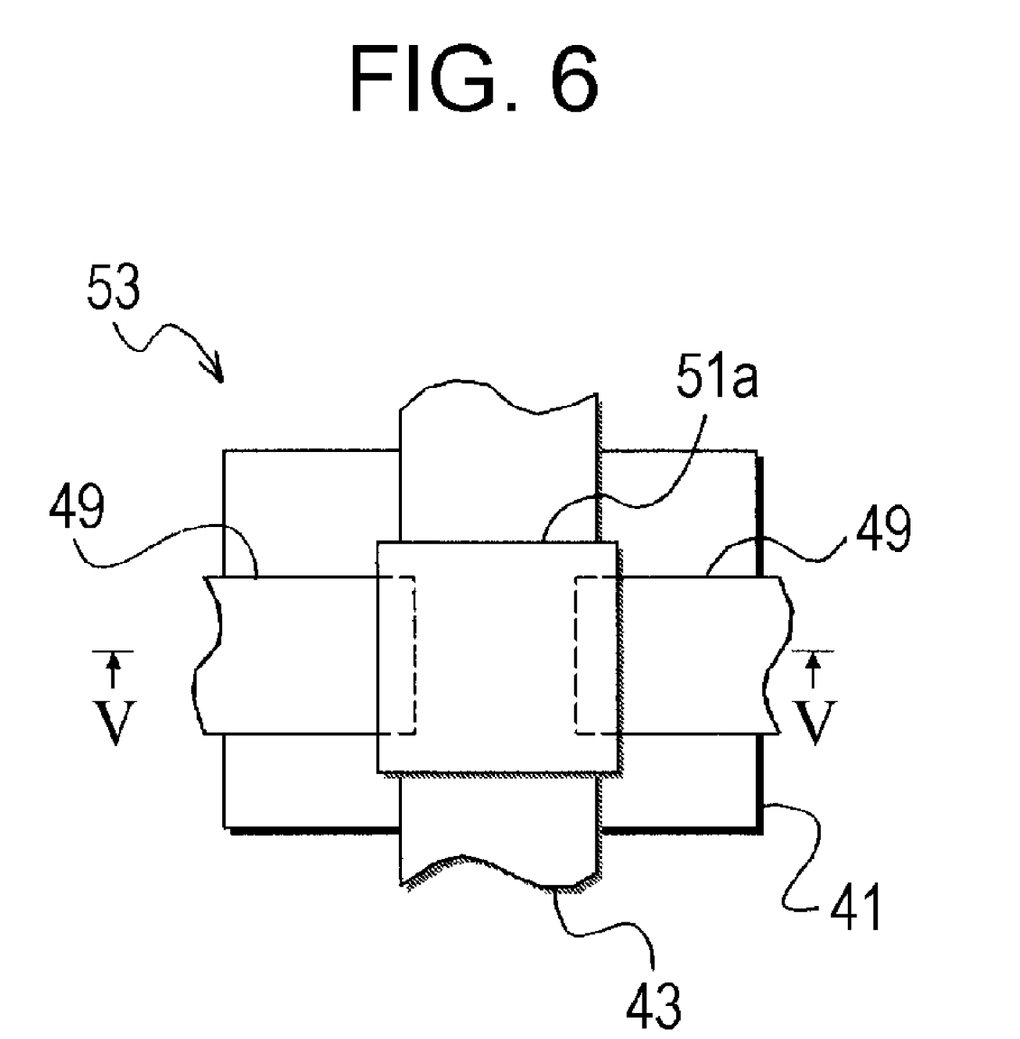
FIG. 6 is a plan view of a bottom-gate thin-film transistor produced according to the fourth embodiment.

As shown in FIG. 5A, a substrate 41 is prepared. The substrate 41 may be the same as the substrate 1 described in the first embodiment. A gate electrode 43 is formed on the substrate 41. The gate electrode 43 is formed by printing, such as inkjet printing, microcontact printing, or screen printing, or photolithography as the method for forming the source/drain electrodes 5 illustrated with reference to FIG. 1B.

Figure 5B:
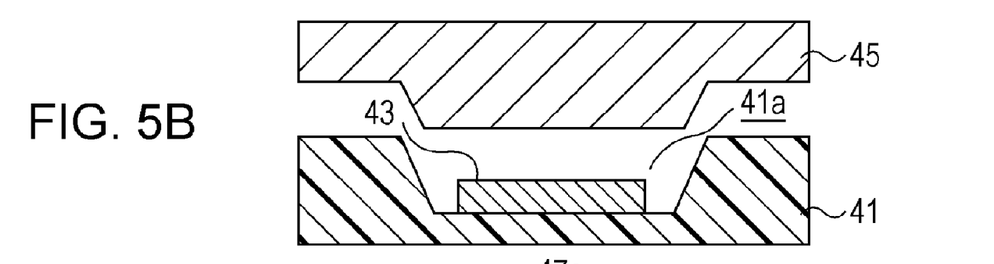

As shown in FIG. 5B, by pressing a stamp 45 having a relief pattern on a surface thereof against the substrate 41, a depression pattern 41a is formed so as to partly include the gate electrode 43 on the substrate 41. The depression pattern 41a has the shape of an active layer in the thin-film transistor to be produced in this embodiment and has the rectangular shape of the gate electrode 43. As a result, part of the gate electrode 43 is disposed across the depression pattern 41a. The same stamp 45 as that used in the first embodiment may be used.

Figure 5C:
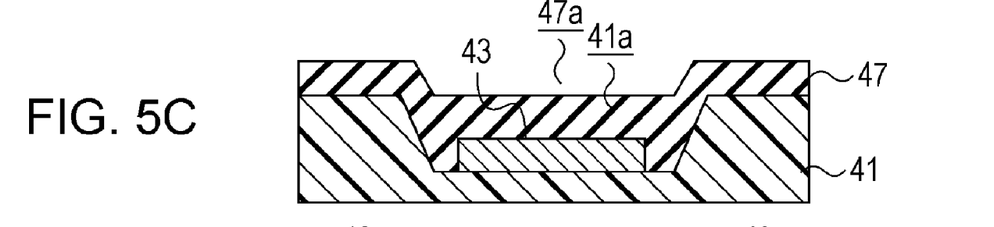

As shown in FIG. 5C, a gate insulating film 47 is formed on the substrate 41 so as to cover the inside walls of the depression pattern 41a. The gate insulating film 47 is formed by spin coating, slit coating, or the like. At this time, it is important to adjust the film-forming conditions such that a depression pattern 47a corresponding to the depression pattern 41a is formed at the surface of the gate insulating film 47.

Figures 5D, 5E:
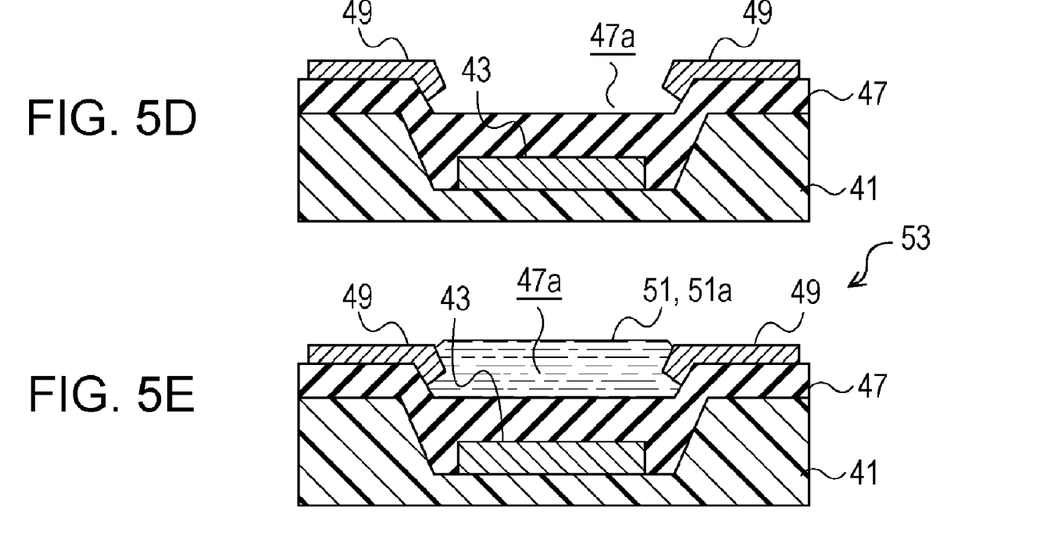

As shown in FIG. 5E, source/drain electrodes 49 are formed by patterning in such a way that the source/drain electrodes 49 are disposed on both edges of the depression pattern 47a. In this case, the source/drain electrodes 49 are formed by patterning using printing, such as inkjet printing, microcontact printing, or screen printing, or photolithography as described in the first embodiment with reference to FIG. 1B.

As shown in FIG. 5E, an application material 51 containing an organic semiconductor material is fed into the depression pattern 47a by printing through the tip of an application nozzle. In this case, for example, the application material 51 is fed into the depression pattern 47a by being dropped through the tip of the application nozzle using inkjet printing, dispensing, or the like. The volume of the liquid application material 51 containing the organic semiconductor material dissolved in a solvent is substantially equal to the capacity of the depression pattern 47a.

The application material 51 fed by printing is solidified to form an active layer 51a composed of the organic semiconductor material. In this case, the solvent in the liquid application material 51 is removed by evaporation to solidify the application material 51, resulting in the active layer 51a. Furthermore, in this case, the volume of the application material 51 fed by printing is substantially equal to the capacity of the depression pattern 47a, and then the application material 51 is solidified. Thus, the height of the surface of the active layer 51a is substantially the same as that of the surface of the gate insulating film 47. The active layer 51a is in contact with the source/drain electrodes 49 at the side walls of the depression pattern 47a.

The formation of the source/drain electrodes 49 described with reference to FIG. 5D and the formation of the active layer 51a described with reference to FIG. 5E may be performed in inverse order as long as damage to then active layer 51a is prevented. When the formation steps are performed in inverse order, and the height of the surface of the active layer 51a formed by printing is higher than that of the surface of the substrate 41, if necessary, the active layer 51a may be planarized by polishing in such a way that the height of the surface of the active layer 51a is substantially the same as that of the surface of the substrate 41, and then the source/drain electrodes 49 may be formed.

As described above, a bottom-gate thin-film transistor is produced as a semiconductor device 53. The semiconductor device 53 includes the active layer 51a composed of an organic semiconductor material and formed by solidifying the application material; and the depression pattern 47a of the gate insulating film 47 covering the surface of the substrate 41, the depression pattern 47a being selectively filled with the active layer 51a.

In the production process according to the fourth embodiment, as described with reference to FIG. 5B, the depression pattern 41a is formed by embossing. The gate insulating film 47 is formed to cover the inner walls of the depression pattern 41a. The application material is fed by printing into the depression pattern 47a covered with the gate insulating film 47 to form the active layer 51a. Thus, the active layer 51a can be formed with high precision by printing without leading to the complication of the production process, as in the first embodiment. Therefore, it is possible to achieve higher levels of integration of the semiconductor device 53 (bottom-gate thin-film transistor) including the active layer 51a.

In each of the first to fourth embodiments described above, treatment for selectively imparting liquid repellency against the application material may be performed before feeding the application material by printing into the depression pattern, provided that this treatment is performed to selectively impart liquid repellency to a surface at the outside of the depression pattern other than the inner walls of the depression pattern. Thus, in the step of feeding the application material by printing into the depression pattern, the extension of the application material is suppressed at the outside of the depression pattern. Therefore, it is possible to form a pattern of the application material by printing with higher form accuracy.

A method for imparting liquid repellency includes forming a material layer (liquid-repellent material layer) on a surface outside the depression pattern, the material layer having low wettability toward the target application material and exhibiting a large contact angle. In this case, the liquid-repellent material layer is formed on another substrate. The surface including the depression pattern is placed on the liquid-repellent material layer to transfer the liquid-repellent material layer into the surface including the depression pattern.

The invention is not limited to the embodiments as described above, where various and suitable modifications thereof can be made.

For example, in each of the first to fourth embodiments, a process in which any one of the active layer or the source/drain electrodes is formed by printing in the depression pattern formed by embossing to produce a thin-film transistor has been described.

However, the present invention may be applied to a method for forming both of the active layer and the source/drain electrodes by printing in the depression pattern formed by embossing. For example, the procedure described in the third embodiment with reference to FIG. 4A to 4E is taken for example. A procedure is exemplified as follows: After the formation of the source/drain electrodes 25a as shown in FIG. 4B, a depression pattern having a rectangular shape is formed by embossing at the substrate 21 between the source/drain electrodes 25a. Then, an active layer is formed in the depression pattern by printing.

Furthermore, the present invention is not limited to the application for the formation of the thin-film transistor as the semiconductor device. For example, when an organic electroluminescent element, i.e., organic light-emitting diode (LED), is formed, a depression pattern is formed by embossing at areas to which an organic semiconductor material is applied by printing before applying the organic semiconductor material (organic electroluminescent material) by printing to the areas corresponding to pixels of organic electroluminescent elements to be formed. Thus, in the application of the organic semiconductor material by printing, the organic semiconductor material can be fed into only the depression pattern. Furthermore, since the depression pattern is formed by embossing, as described in the embodiments, it is possible to minimize the increase of components. Therefore, it is possible to produce a high-density-pixel display through a smaller number of steps.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A process for producing a semiconductor device, comprising:
    a first embossing step of pressing a stamp having a relief pattern onto a surface of a substrate to form a depression pattern on the surface of the substrate;
    a second step of forming source and drain electrodes on portions of the surface of the substrate other than the depression pattern, the source electrode being in contact a first edge of the depression pattern and the drain electrode being in contact with a second edge of the depression pattern;
    a third step of feeding an application material composed of a semiconductor material or a conductive material into the depression pattern by printing, the application material being in contact with the source and drain electrodes; and
    a fourth step of curing the application material fed by printing.

2. The process for producing a semiconductor device according to claim 1, wherein the substrate is covered with a resin material layer, and in the first step, the resin material layer is cured while the stamp having the relief pattern is being pressed against the uncured resin material layer, and then the stamp is detached from the substrate to form the depression pattern.

3. The process for producing a semiconductor device according to claim 2, wherein the resin material layer is composed of an ultraviolet ray-curable resin.

4. The process for producing a semiconductor device according to claim 1, wherein in the third step, the volume of the application material fed by printing is substantially equal to the capacity of the depression pattern.

5. The process for producing a semiconductor device according to claim 1, wherein in the third step, the application material is fed into the depression pattern by being dropped through an application nozzle.

6. The process for producing a semiconductor device according to claim 1, further comprising: between the first step and the third step, a treatment step of selectively imparting liquid repellency against the application material to the outside of the depression pattern on the surface of the substrate.

7. The process for producing a semiconductor device according to claim 1, further comprising: after the first step, forming an insulating film on the substrate to cover the inside walls of the depression pattern, wherein in the third step, the application material is fed into the depression pattern covered with the insulating film by printing.

8. The process for producing a semiconductor device according to claim 1, wherein an organic semiconductor material is used as the application material.

9. The process for producing a semiconductor device according to claim 1, wherein an organic material containing a luminescent material is used as the application material to form an organic layer in an organic luminescent element.

10. The process for producing a semiconductor device according to claim 1, further comprising: between the second step and the fourth step, a step of planarizing the application material such that a top surface of the application material is substantially level with a top surface of the substrate.

11. The process for producing a semiconductor device according to claim 1, wherein in the third step, the application material is fed in such a manner that a top surface of the application material is substantially level with a top surface of the substrate.

12. A process for producing a semiconductor device, comprising:

forming a gate electrode on a substrate;

pressing a stamp having a relief pattern onto a surface of the substrate to form a first depression pattern on the surface of the substrate, wherein the depression pattern is formed so as to at least partially include the gate electrode;

forming an insulating film on the substrate to cover an inner wall of the first depression pattern such that a second depression pattern corresponding to the first depression pattern is formed at a surface of the insulating film;

forming source and drain electrodes on at least portions of the surface of the insulating film other than the second depression pattern, the source electrode being in contact with a first edge of the second depression pattern and the drain electrode being in contact with a second edge of the second depression pattern; and feeding an application material composed of a semiconductor material or a conductive material constituting an active layer into the second depression pattern by printing, the application material being in contact with the source and drain electrodes.

* * * * *